United States Patent
Jeon et al.

(10) Patent No.: US 11,594,806 B2
(45) Date of Patent: Feb. 28, 2023

(54) ELECTRONIC DEVICE INCLUDING ANTENNA MODULE

(71) Applicant: Samsung Electronics Co., Ltd., Suwon-si (KR)

(72) Inventors: Jaewoong Jeon, Suwon-si (KR); Jaewun Lee, Suwon-si (KR); Jaeyoung Huh, Suwon-si (KR); Chanyoul Park, Suwon-si (KR); Hojong Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 221 days.

(21) Appl. No.: 17/154,811

(22) Filed: Jan. 21, 2021

(65) Prior Publication Data

US 2021/0249759 A1    Aug. 12, 2021

(30) Foreign Application Priority Data

Feb. 6, 2020  (KR) .......................... 10-2020-0014327

(51) Int. Cl.
| | |
|---|---|
| *H01Q 1/24* | (2006.01) |
| *H01Q 1/42* | (2006.01) |
| *H05K 7/14* | (2006.01) |
| *H05K 5/00* | (2006.01) |
| *H04B 1/3827* | (2015.01) |

(52) U.S. Cl.
CPC .............. *H01Q 1/243* (2013.01); *H01Q 1/42* (2013.01); *H05K 5/0017* (2013.01); *H05K 7/1427* (2013.01); *H04B 1/3827* (2013.01)

(58) Field of Classification Search
CPC .............. H01Q 1/24; H01Q 1/42; H05K 5/00; H05K 7/14; H04B 1/38
See application file for complete search history.

(56) References Cited

U.S. PATENT DOCUMENTS

| | | |
|---|---|---|
| 9,859,607 B2 | 1/2018 | Hwang et al. |
| 10,056,695 B2 | 8/2018 | Ayala Vazquez et al. |
| 2004/0145521 A1 | 7/2004 | Hebron et al. |

(Continued)

OTHER PUBLICATIONS

International Search Report and Written Opinion of the International Searching Authority in connection with International Application No. PCT/KR2020/017911 dated Mar. 15, 2021, 6 pages.

*Primary Examiner* — Andrea Lindgren Baltzell

(57) ABSTRACT

Provided is an electronic device including an antenna module. The electronic device may include: a housing constituting an external appearance of the electronic device, a support member including a first bridge, a printed circuit board coupled to one surface of the support member, a first antenna constituting a first part of the housing and connected to the support member through the first bridge, a second antenna constituting a second part of the housing, a cut-off portion separating the first antenna and the second antenna, and a first connection member and a second connection member coupled to the first bridge. The first connection member may be connected to a ground of the printed circuit board through a first capacitor and may be disposed closer to the cut-off portion than the second connection member connected to the ground of the printed circuit board through a second capacitor. Other embodiments are also possible.

20 Claims, 14 Drawing Sheets

(56) References Cited

U.S. PATENT DOCUMENTS

| | | |
|---|---|---|
| 2017/0047641 A1 | 2/2017 | Kim et al. |
| 2017/0244151 A1* | 8/2017 | Han ........................ H01Q 9/42 |
| 2017/0244163 A1 | 8/2017 | Yoo et al. |
| 2018/0278731 A1* | 9/2018 | Lee ..................... H04M 1/0202 |
| 2019/0067821 A1 | 2/2019 | Kim et al. |

* cited by examiner

ELECTRONIC DEVICE INCLUDING ANTENNA MODULE

CROSS-REFERENCE TO RELATED APPLICATION

This application is based on and claims priority under 35 U.S.C. 119 to Korean Patent Application No. 10-2020-0014327, filed on Feb. 6, 2020, in the Korean Intellectual Property Office, the disclosure of which is herein incorporated by reference in its entirety.

BACKGROUND

1. Field

Various embodiments of the disclosure relate to an electronic device including an antenna module.

2. Description of Related Art

Electronic devices such as smartphones and tablet personal computers are widely used. An electronic device may transmit and receive various data to and from another electronic device through wireless communication.

Electronic devices may provide services related to, for example, global positioning system (GPS), Wi-Fi, long-term evolution (LTE), near field communication (NFC), Bluetooth, and/or magnetic stripe transmission (MST) communication.

Such an electronic device may include at least one antenna to perform long-distance communication and short-range communication.

SUMMARY

At least some of the housing constituting the external appearance of an electronic device may be made of a conductive material (e.g., metal).

The electronic device may use at least a portion of the housing as a radiator of an antenna for wireless communication. The housing may be segmented by a cut-off portion into multiple parts, which may be used as plural antennas. The plural antennas may cover various frequency bands.

The number of cut-off portions formed in the housing of the electronic device may be restricted in order to maintain the design and strength of the electronic device.

When an electronic device includes a plurality of antennas, radiation performance may be degraded due to interference between adjacent antennas. Further it may be difficult to achieve resonance in a desired frequency band. Additionally, in the electronic device, noise generated from components mounted on a printed circuit board (PCB) may be transmitted to at least a part of the housing, affecting antenna performance.

Various embodiments of the present disclosure may provide an electronic device that maintains mechanical strength and secures antenna performance by using at least one connection member disposed close to the cut-off portion.

According to various embodiments of the disclosure, an electronic device is provided. The electronic device may include: a housing constituting an external appearance of the electronic device; a support member including a first bridge; a printed circuit board coupled to one surface of the support member; a first antenna constituting a first part of the housing and connected to the support member through the first bridge; a second antenna constituting a second part of the housing; a cut-off portion separating the first antenna and the second antenna; and a first connection member and a second connection member coupled to the first bridge, wherein the first connection member may be connected to a ground of the printed circuit board through a first capacitor and may be disposed closer to the cut-off portion than the second connection member connected to the ground of the printed circuit board through a second capacitor.

According to various embodiments of the disclosure, an electronic device is provided. The electronic device may include: a housing constituting an external appearance of the electronic device; a support member including a first bridge and a second bridge; a printed circuit board coupled to one surface of the support member; a display coupled to the other side of the support member; a first antenna constituting a first part of the housing and connected to the support member through the first bridge; a second antenna constituting a second part of the housing and connected to the support member through the second bridge; a cut-off portion separating the first antenna and the second antenna; a first connection member and a second connection member coupled to the first bridge; a switch circuit connected to the first connection member; and a processor operatively connected to the display and the switch circuit, wherein the processor may be configured to adjust a capacitance value of the first connection member by controlling the switch circuit.

Various embodiments of the disclosure may provide an electronic device with excellent antenna performance and improved mechanical strength by blocking transmission of noise generated from the printed circuit board to the antenna by using at least one connection member disposed close to the cut-off portion.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

FIGS. 1 through 14, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Figure 1:
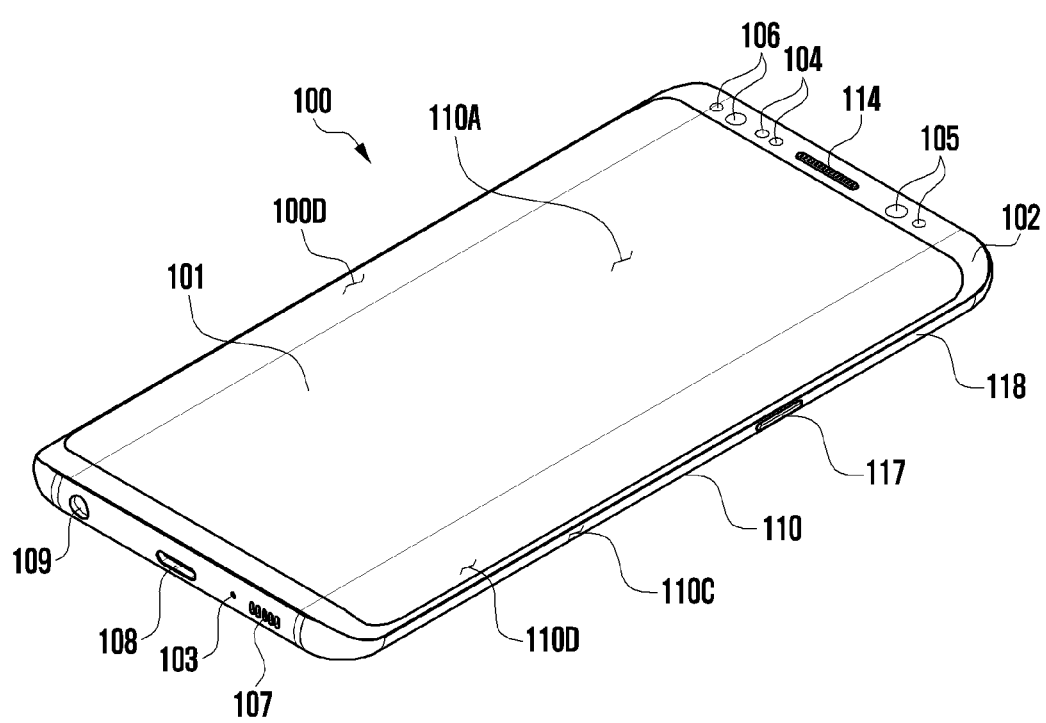
FIG. 1 illustrates a front perspective view of a mobile electronic device according to various embodiments of the disclosure.

FIG. 1 illustrates a perspective view of the front surface of a mobile electronic device according to an embodiment of the disclosure.

Figure 2:
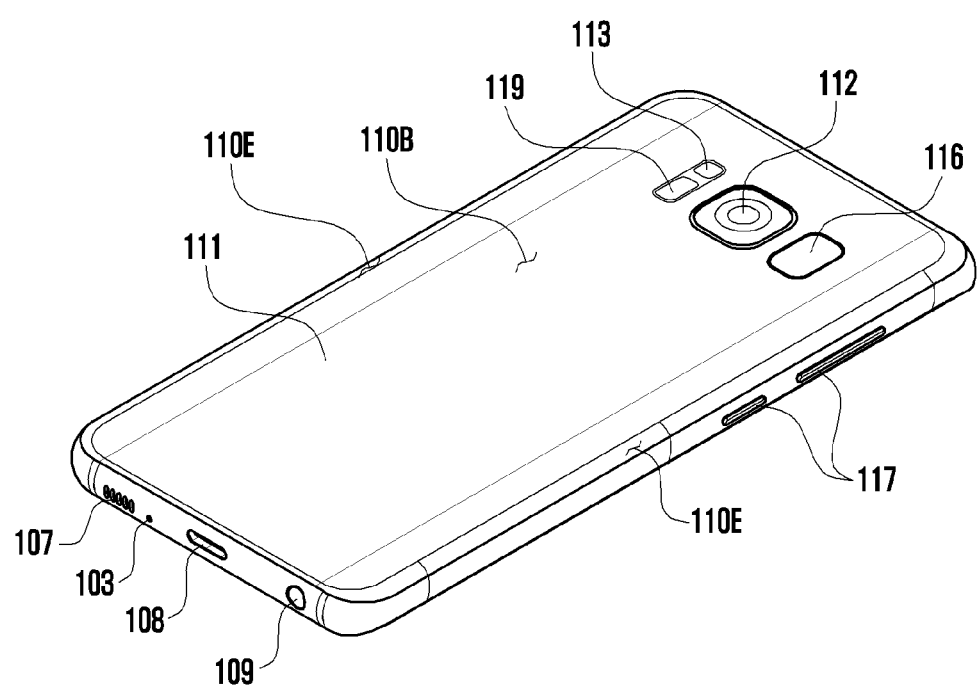
FIG. 2 illustrates a rear perspective view of the electronic device of FIG. 1 according to various embodiments of the disclosure.

FIG. 2 illustrates a perspective view of the rear surface of the electronic device of FIG. 1 according to an embodiment of the disclosure.

Referring to FIG. 1 and FIG. 2, an electronic device 100 according to an embodiment may include a housing 110 including a first surface (or front surface) 110A, a second surface (or rear surface) 110B, and a side surface 110C surrounding the space between the first surface 110A and the second surface 110B. In another embodiment (not illustrated), the housing may denote a structure that forms a part of the first surface 110A, the second surface 110B, and the side surface 110C illustrated in FIG. 1. According to an embodiment, the first surface 110A may be formed by a front plate 102, at least a part of which is substantially transparent (for example, a glass plate including various coating layers, or a polymer plate). The second surface 110B may be formed by a rear plate 111 that is substantially opaque. The rear plate 111 may be made of coated or colored glass, ceramic, polymer, metal (for example, aluminum, stainless steel (STS), or magnesium), or a combination of at least two of the above-mentioned materials. The side surface 110C may be formed by a side bezel structure (or "side member") 118 which is coupled to the front plate 102 and to the rear plate 111, and which includes metal and/or polymer. In some embodiments, the rear plate 111 and the side bezel structure 118 may be formed integrally and may include the same material (for example, a metal material such as aluminum).

In the illustrated embodiment, the front plate 102 may include two first areas 110D on both ends of the long edge of the front plate 102 such that the two first areas 110D bend from the first surface 110A toward the rear plate 111 and extend seamlessly. In the illustrated embodiment (see FIG. 2), the rear plate 111 may include two second areas 110E on both ends of the long edge such that the two second areas 110E bend from the second surface 110B toward the front plate 102 and extend seamlessly. In some embodiments, the front plate 102 (or the rear plate 111) may include only one of the first areas 110D (or the second areas 110E). In another embodiment, a part of the first areas 110D or the second areas 110E may not be included. In the above embodiments, when seen from the side surface of the electronic device 100, the side bezel structure 118 may have a first thickness (or width) on a part of the side surface, which does not include the first areas 110D or the second areas 110E as described above, and may have a second thickness that is smaller than the first thickness on a part of the side surface, which includes the first areas 110D or the second areas 110E.

According to an embodiment, the electronic device 100 may include at least one of a display 101, audio modules 103, 107, and 114, sensor modules 104, 116, and 119, camera modules 105, 112, and 113, a key input device 117, a light-emitting element 106, and connector holes 108 and 109. In some embodiments, at least one of the constituent elements (for example, the key input device 117 or the light-emitting element 106) of the electronic device 100 may be omitted, or the electronic device 100 may additionally include another constituent element.

The display 101 may be exposed through a corresponding part of the front plate 102, for example. In some embodiments, at least a part of the display 101 may be exposed through the front plate 102 that forms the first areas 110D of the side surface 110C and the first surface 110A. In some embodiments, the display 101 may have a corner formed in substantially the same shape as that of the adjacent outer periphery of the front plate 102. In another embodiment (not illustrated), in order to increase the area of exposure of the display 101, the interval between the outer periphery of the display 101 and the outer periphery of the front plate 102 may be formed to be substantially identical.

In another embodiment (not illustrated), a recess or an opening may be formed in a part of the screen display area of the display 101, and at least one of an audio module 114, a sensor module 104, a camera module 105, and a light-emitting element 106 may be included and aligned with the recess or the opening. In another embodiment (not illustrated), on the back surface of the screen display area of the display 101, at least one of an audio module 114, a sensor module 104, a camera module 105, a fingerprint sensor 116, and a light-emitting element 106 may be included. In another embodiment (not illustrated), the display 101 may be coupled to or arranged adjacent to a touch sensing circuit, a pressure sensor capable of measuring the intensity (pressure) of a touch, and/or a digitizer that detects a magnetic field-type stylus pen. In some embodiments, at least a part of the sensor modules 104 and 119 and/or at least a part of the key input device 117 may be arranged in the first areas 110D and/or the second areas 110E.

The audio modules 103, 107, and 114 may include a microphone hole 103 and speaker holes 107 and 114. A microphone for acquiring an external sound may be arranged in the microphone hole 103, and a plurality of microphones may be arranged therein such that the direction of a sound can be sensed in some embodiments. The speaker holes 107 and 114 may include an outer speaker hole 107 and a speech receiver hole 114. In some embodiments, the speaker holes 107 and 114 and the microphone hole 103 may be implemented as a single hole, or a speaker may be included (for example, a piezoelectric speaker) without the speaker holes 107 and 114.

The sensor modules 104, 116, and 119 may generate an electric signal or a data value corresponding to the internal operating condition of the electronic device 100 or the external environment condition thereof. The sensor modules 104, 116, and 119 may include, for example, a first sensor module 104 (for example, a proximity sensor) arranged on the first surface 110A of the housing 110, and/or a second sensor module (not illustrated) (for example, a fingerprint sensor), and/or a third sensor module 119 (for example, an HRM sensor) arranged on the second surface 110B of the housing 110, and/or a fourth sensor module 116 (for example, a fingerprint sensor). The fingerprint sensor may be arranged not only on the first surface 110A (for example, the display 101) of the housing 110, but also on the second surface 110B thereof. The electronic device 100 may further include a sensor module not illustrated, for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or a luminance sensor 104.

The camera modules 105, 112, and 113 may include a first camera device 105 arranged on the first surface 110A of the electronic device 100, a second camera device 112 arranged on the second surface 110B thereof, and/or a flash 113. The camera devices 105 and 112 may include a single lens or a plurality of lenses, an image sensor, and/or an image signal processor. The flash 113 may include, for example, a light-emitting diode or a xenon lamp. In some embodiments, two or more lenses (an infrared camera, a wide-angle lens, and a telephoto lens) and image sensors may be arranged on a single surface of the electronic device 100.

The key input device 117 may be arranged on the side surface 110C of the housing 110. In another embodiment, the electronic device 100 may not include a part of the above-mentioned key input device 117 or the entire key input device 117, and the key input device 117 (not included) may be implemented in another type, such as a soft key, on the display 101. In some embodiments, the key input device may include a sensor module 116 arranged on the second surface 110B of the housing 110.

The light-emitting element 106 may be arranged on the first surface 110A of the housing 110, for example. The light-emitting element 106 may provide information regarding the condition of the electronic device 100 in a light type, for example. In another embodiment, the light-emitting element 106 may provide a light source that interworks with operation of the camera module 105, for example. The light-emitting element 106 may include, for example, a light-emitting diode (LED), an infrared light-emitting diode (IR LED), and a xenon lamp.

The connector holes 108 and 109 may include a first connector hole 108 capable of containing a connector (for example, a universal serial bus (USB) connector) for transmitting/receiving power and/or data to/from an external electronic device, and/or a second connector hole (for example, an earphone jack) 109 capable of containing a connector for transmitting/receiving an audio signal to/from the external electronic device.

Figure 3:
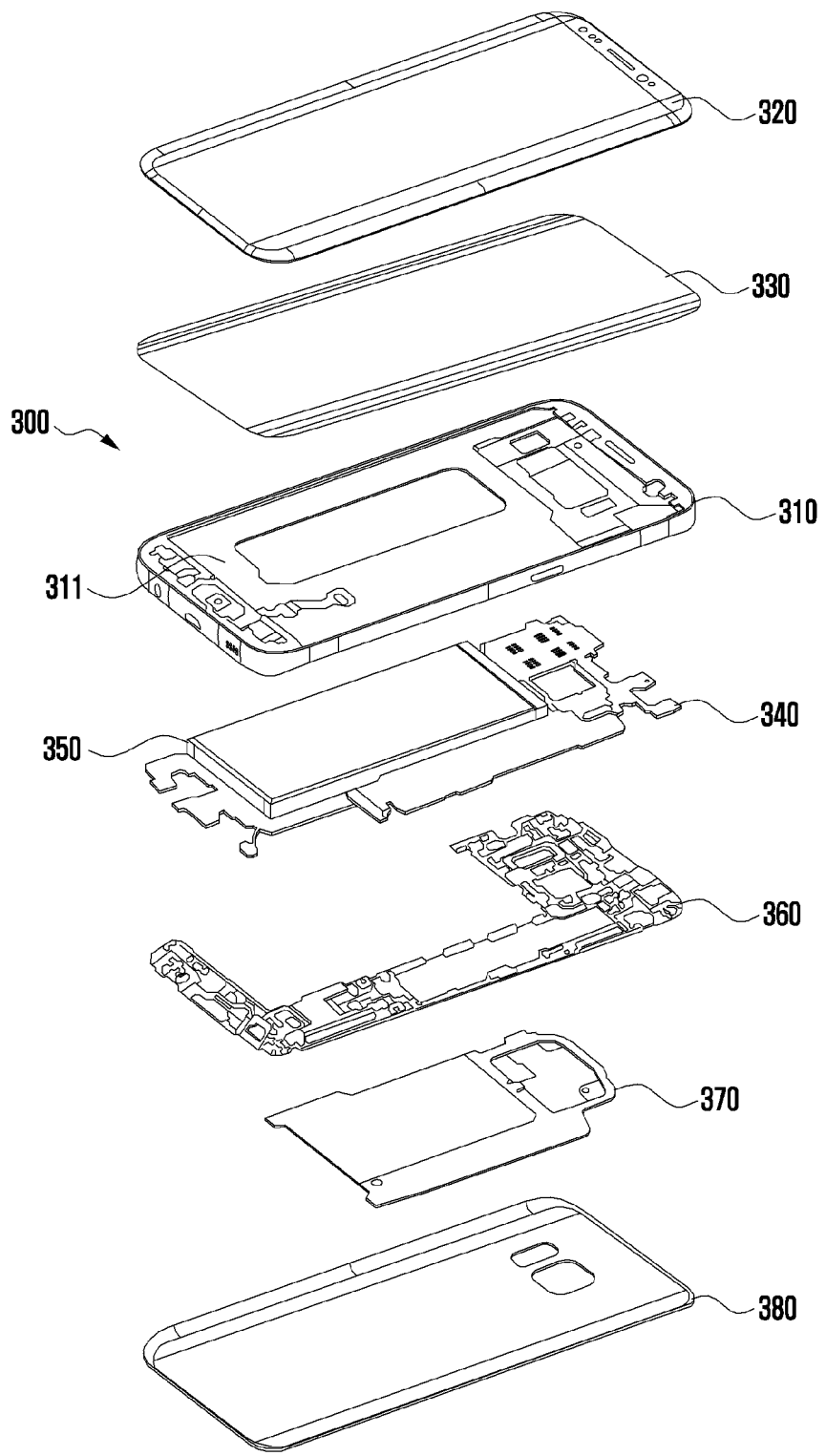
FIG. 3 illustrates an exploded perspective view of the electronic device of FIG. 1 according to various embodiments of the disclosure.

FIG. 3 is a developed perspective view of an electronic device of FIG. 1 according to an embodiment of the disclosure.

Referring to FIG. 3, an electronic device 300 may include a side bezel structure 310, a first support member 311 (for example, a bracket), a front plate 320, a display 330, a printed circuit board 340, a battery 350, a second support member 360 (for example, a rear case), an antenna 370, and a rear plate 380. In some embodiments, at least one of the constituent elements (for example, the first support member 311 or the second support member 360) of the electronic device 300 may be omitted, or the electronic device 300 may further include another constituent element. At least one of the constituent elements of the electronic device 300 may be identical or similar to at least one of the constituent elements of the electronic device 100 of FIG. 1 or FIG. 2, and repeated descriptions thereof will be omitted herein.

The first support member 311 may be arranged inside the electronic device 300 and connected to the side bezel structure 310, or may be formed integrally with the side bezel structure 310. The first support member 311 may be made of a metal material and/or a nonmetal (for example, polymer) material, for example. The display 330 may be coupled to one surface of the first support member 311, and the printed circuit board 340 may be coupled to the other surface thereof. A processor, a memory, and/or an interface may be mounted on the printed circuit board 340. The processor may include, for example, one or more of a central processing device, an application processor, a graphic processing device, an image signal processor, a sensor hub processor, or a communication processor.

The memory may include a volatile memory or a non-volatile memory, for example.

The interface may include, for example, a high definition multimedia interface (HDMI), a universal serial bus (USB) interface, a secure digital (SD) card interface, and/or an audio interface. The interface may connect the electronic device 300 with an external electronic device electrically or physically, for example, and may include a USB connector, an SD card/multi-media card (MMC) connector, or an audio connector.

The battery 350 is a device for supplying power to at least one constituent element of the electronic device 300, and may include a non-rechargeable primary cell, a rechargeable secondary cell, or a fuel cell, for example. At least a part of the battery 350 may be arranged on substantially the same plane with the printed circuit board 340, for example. The battery 350 may be arranged integrally inside the electronic device 300, or may be arranged such that the same can be attached to/detached from the electronic device 300.

The antenna 370 may be arranged between the rear plate 380 and the battery 350. The antenna 370 may include, for example, a near field communication (NFC) antenna, a wireless charging antenna, and/or a magnetic secure transmission (MST) antenna. The antenna 370 may conduct near-field communication with an external device or may wirelessly transmit/receive power necessary for charging, for example. In another embodiment, an antenna structure may be formed by a part or a combination of the side bezel structure 310 and/or the first support member 311.

The electronic devices may further include at least one of parts of furniture or buildings/structures, electronic boards, electronic signature receiving devices, projectors, or various measuring instruments (such as water meters, electricity meters, gas meters, or wave meters, and the like). The electronic devices may be one or more combinations of the above-mentioned devices. The electronic devices may be flexible electronic devices. Also, the electronic devices are not limited to the above-mentioned devices, and may include new electronic devices according to the development of new technologies.

Embodiments of the disclosure will be described herein below with reference to the accompanying drawings. However, the embodiments of the disclosure are not limited to the specific embodiments and should be construed as including all modifications, changes, equivalent devices and methods, and/or alternative embodiments of the disclosure.

The terms "A or B," "at least one of A or/and B," or "one or more of A or/and B" as used herein include all possible combinations of items enumerated with them. For example, "A or B," "at least one of A and B," or "at least one of A or B" means (1) including at least one A, (2) including at least one B, or (3) including both at least one A and at least one B.

The terms such as "first" and "second" as used herein may modify various elements regardless of an order and/or importance of the corresponding elements, and do not limit the corresponding elements. These terms may be used for the purpose of distinguishing one element from another element. For example, a first user device and a second user device may indicate different user devices regardless of the order or importance. For example, a first element may be referred to as a second element without departing from the scope the disclosure, and similarly, a second element may be referred to as a first element.

It will be understood that, when an element (for example, a first element) is "(operatively or communicatively) coupled with/to" or "connected to" another element (for example, a second element), the element may be directly coupled with/to another element, and there may be an intervening element (for example, a third element) between the element and another element. To the contrary, it will be understood that, when an element (for example, a first element) is "directly coupled with/to" or "directly connected to" another element (for example, a second element), there is no intervening element (for example, a third element) between the element and another element.

The term "module" as used herein may be defined as, for example, a unit including one of hardware, software, and firmware or two or more combinations thereof. The term "module" may be interchangeably used with, for example, the terms "unit", "logic", "logical block", "component", or "circuit", and the like. The "module" may be a minimum unit of an integrated component or a part thereof. The "module" may be a minimum unit performing one or more functions or a part thereof.

Figure 4:
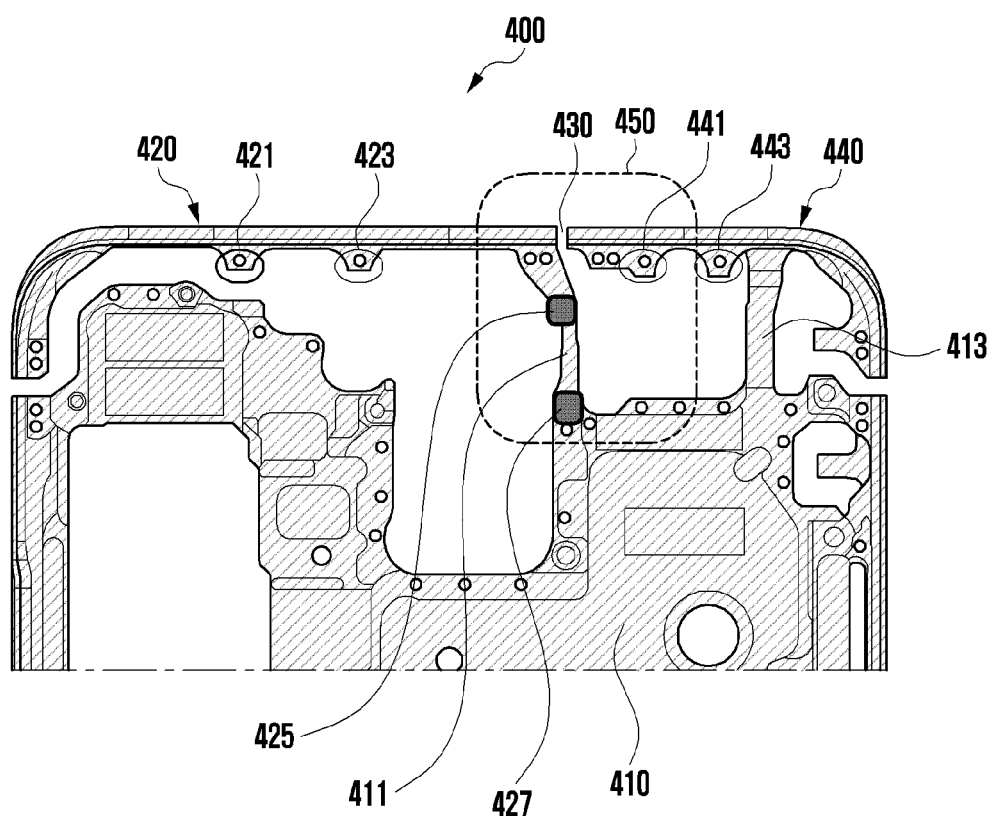
FIG. 4 illustrates a partial schematic view showing a configuration of the electronic device including an antenna module according to various embodiments of the disclosure.

FIG. 4 illustrates a partial schematic view showing a configuration of an electronic device including an antenna module, according to various embodiments of the disclosure.

In various embodiments, the electronic device 400 of FIG. 4 may include the electronic device 100 or 300 shown in FIGS. 1 to 3. FIG. 4 may be a transparent perspective view of an upper portion of the electronic device 400 when the electronic device 400 is placed vertically.

With reference to FIG. 4, in various embodiments of the disclosure, the electronic device 400 may include a support member 410, a first antenna 420, a first connection member 425, a second connection member 427, a cut-off portion 430, and a second antenna 440.

In one embodiment, the support member 410 may be disposed inside the electronic device 400. The support member 410 may be connected to the first antenna 420 through a first bridge 411. The support member 410 may be integrally formed with the first antenna 420 and the second antenna 440 by using the first bridge 411 and the second bridge 413.

In various embodiments, the support member 410 may include the first support member 311 shown in FIG. 3. The support member 410 may be made of, for example, a metal material and/or a non-metal material (e.g., polymer). The support member 410 may include a first surface coupled with the display (e.g., display 330 in FIG. 3), and a second surface coupled with the printed circuit board (e.g., printed circuit board 340 in FIG. 3). The first bridge 411 and the second bridge 413 may include a conductive member.

In one embodiment, the first antenna 420 may be connected to the support member 410 through the first bridge 411. The first antenna 420 may include a first ground part 421 and a first feeding part 423. The first ground part 421 and the first feeding part 423 may be disposed on the inner side of the first antenna 420. The first ground part 421 may ground the first antenna 420. The first feeding part 423 may transmit and receive signals through the first antenna 420.

In various embodiments, the first antenna 420 may be used to transmit and receive signals in a first frequency band (e.g., low or mid frequencies). For example, the first antenna 420 may transmit and receive signals of about 600 to 2200 MHz.

The first frequency band is an example, and signals of other frequency bands may be transmitted and received, according to various embodiments in accordance with this disclosure. For example, the first antenna 420 is not limited to the first frequency band, and may be used to transmit and receive signals in a second frequency band (e.g., mid or high frequencies).

In various embodiments, the first feeding part 423 may be disposed closer to the first bridge 411 or the cut-off portion 430 rather than the first ground part 421. The positions of the first ground part 421 and the first feeding part 423 may be changed. The first ground part 421 may be omitted.

In one embodiment, the first connection member 425 may be formed on a part (e.g., upper part) of the first bridge 411 and may be disposed close to the cut-off portion 430. The first connection member 425 may be connected to a first capacitor (e.g., variable capacitor). The first capacitor connected to the first connection member 425 may have a variable capacitance value. The first connection member 425 may serve as a ground of the first antenna 420. The first connection member 425 may be connected to the printed circuit board (e.g., printed circuit board 340 in FIG. 3) through a contact component (e.g., C clip). The first connection member 425 may be connected to the ground of the printed circuit board through the first capacitor.

In one embodiment, the second connection member 427 may be formed on another part (e.g., lower part) of the first bridge 411. The second connection member 427 may be disposed under the first connection member 425. The second connection member 427 may be formed on the first bridge 411 at a position farther from the cut-off portion 430 than the first connection member 425. The second connection member 427 may be connected to a second capacitor (e.g., fixed capacitor). The second capacitor connected to the second connection member 427 may have a fixed capacitance value. The second connection member 427 may be connected to a contact component (e.g., C clip) provided on the printed circuit board (e.g., printed circuit board 340 in FIG. 3). The second connection member 427 may be connected to the ground of the printed circuit board through the second capacitor. The second connection member 427 may serve as a noise stopper that blocks noise generated from electronic components and/or elements mounted on the printed circuit board (e.g., printed circuit board 340 in FIG. 3) from being transmitted to the first antenna 420 or the second antenna 440.

In various embodiments, the first connection member 425 and the second connection member 427 may be disposed close to the cut-off portion 430 to form a parasitic antenna.

In one embodiment, the cut-off portion 430 may be formed between the first antenna 420 and the second antenna 440. The cut-off portion 430 may physically separate the first antenna 420 and the second antenna 440. The cut-off portion 430 may be filled with a non-conductive material.

In various embodiments, the non-conductive material may be an insulator (or, dielectric) including at least one of polyimide, plastic, polymer, or ceramic. The cut-off portion 430 may prevent foreign substances from entering the electronic device 400 from the outside.

In one embodiment, the second antenna 440 may be connected to the support member 410 through the second bridge 413. The second antenna 440 may include a second feeding part 441 and a second ground part 443. The second feeding part 441 and the second ground part 443 may be disposed on the inner side of the second antenna 440. The second feeding part 441 may transmit and receive signals through the second antenna 440. The second ground part 443 may ground the second antenna 440. The second feeding part 441 may be disposed closer to the cut-off portion 430 than the second ground part 443. The second ground part 443 may be omitted.

In various embodiments, the second antenna 440 may be used to transmit and receive signals in a second frequency band (e.g., mid or high frequencies). For example, the second antenna 440 may transmit and receive signals of about 1.2 to 2.2 GHz or about 2.4 to 5.0 GHz.

The second frequency band is an example, and signals of other frequency bands may be transmitted and received, according to various embodiments in accordance with this disclosure. The frequency bands of the first antenna 420 and the second antenna 440 may be different. The second antenna 440 is not limited to the second frequency band (e.g., mid or high frequencies) and may be used to transmit and receive signals in the above-described first frequency band (e.g., low or mid frequencies).

In various embodiments, at least a portion of the first antenna 420, the cut-off portion 430, at least a portion of the second antenna 440, the second feeding part 441, and the first connection member 425 and second connection member 427 formed in the first bridge 411 may form a coupling zone 450.

In various embodiments, the first antenna 420, the first ground part 421, the first feeding part 423, the first connection member 425, the second connection member 427, the cut-off portion 430, the second antenna 440, the second feeding part 441 and/or the second ground part 443 may constitute an antenna module.

Figure 5:
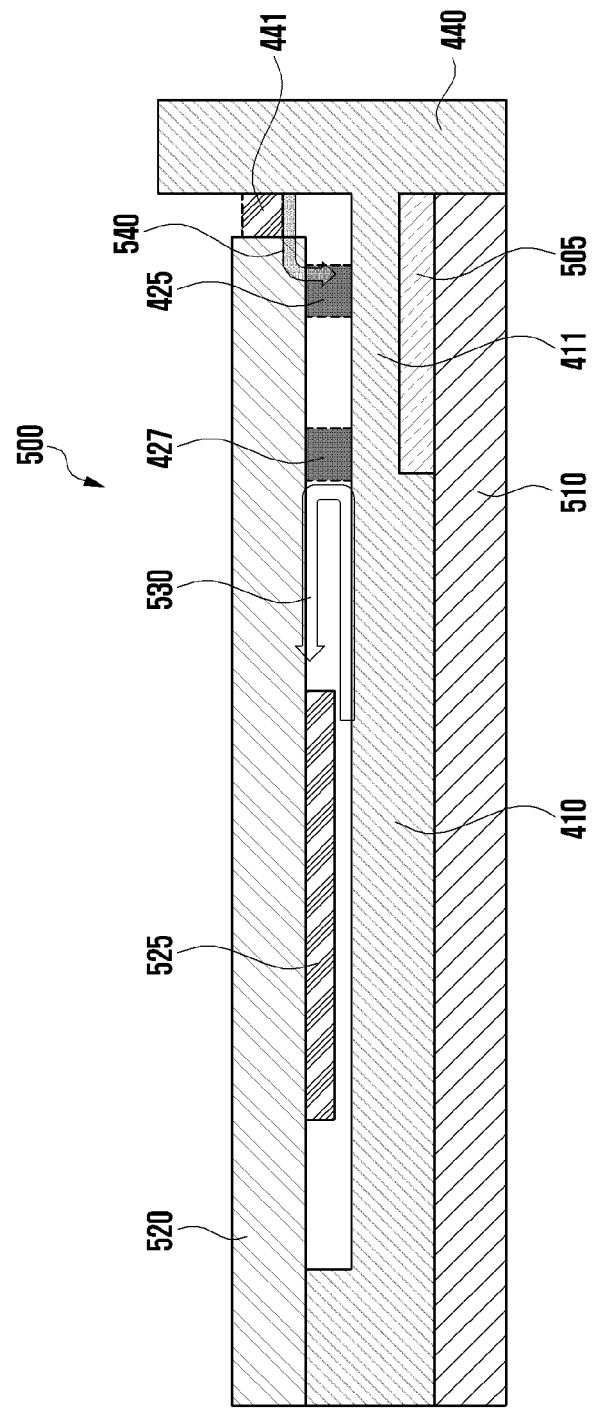
FIG. 5 illustrates a partial side view showing a configuration of the electronic device including an antenna module according to various embodiments of the disclosure.

FIG. 5 illustrates a partial side view showing a configuration of the electronic device including an antenna module according to various embodiments of the disclosure.

In the following description of FIG. 5, repeated descriptions of the same configuration and function as those in the embodiment of FIG. 4 may be omitted.

In various embodiments, the electronic device 500 of FIG. 5 may include the electronic device 100, 300 or 400 shown in FIGS. 1 to 4. The embodiment in relation to the electronic device 500 of FIG. 5 may be applied to the embodiment in relation to the electronic device 400 of FIG. 4 described above.

With reference to FIG. 5, in various embodiments of the disclosure, the electronic device 500 may include a display 510 and a printed circuit board 520.

In one embodiment, the display 510 may be coupled to a first surface of the support member 410. The display 510 may be coupled to at least a portion of the support member 410 including the first bridge 411 or second bridge 413 by using an elastic member 505 (e.g., sponge). The elastic member 505 may absorb an external shock to prevent damage to the display 510.

In various embodiments, the display 510 may include the display 330 shown in FIG. 3. The display 510 may display information input by the user on the electronic device 500 or display information to be provided to the user. The display 510 may perform an input function and a display function.

In one embodiment, the printed circuit board 520 may be coupled to a second surface of the support member 410. Various electronic elements 525 may be mounted on the printed circuit board 520.

In various embodiments, the electronic elements 525 mounted on the printed circuit board 520 may include at least one of a processor, a memory, a radio frequency IC (RFIC), a power management IC (PMIC), a charger IC, a modem IC, or an interface. The printed circuit board 520 may include contact components (e.g., C-clip, boss hole, screw or rib, conductive pillow foam) for contacting the support member 410, the first connection member 425 and/or the second connection member 427.

In various embodiments, the processor may perform overall operations and process data of the electronic device 500. For example, the processor may include at least one of a central processing unit (CPU), an application processor, a graphics processing unit (GPU), an image signal processor, a sensor hub processor, or a communication processor.

In various embodiments, the memory stores programs for processing and controlling the processor equipped in the electronic device 500, an operating system (OS), various applications, and input/output data, and may store a program that controls the overall operation of the electronic device 500. The memory may store a user interface provided by the electronic device 500 and various configuration information required for processing in the electronic device 500.

In one embodiment, the first connection member 425 and the second connection member 427 may be disposed between the printed circuit board 520 and the support member 410.

In one embodiment, the first connection member 425 may form a path 540 for inducing a current of the second antenna 440 between the second feeding part 441 close to the cut-off portion 430 and the support member 410 (or, first bridge 411). For example, the first connection member 425 may be a C clip mounted on the printed circuit board 520 and may be grounded through a capacitor mounted on the printed circuit board 520, forming the path 540.

In one embodiment, the second connection member 427 may be disposed closer to the electronic elements 525 than the first connection member 425. The second connection member 427 may block noise generated from the electronic elements 525 mounted on the printed circuit board 520 from being transmitted to the second antenna 440 (or, first antenna 420). The second connection member 427 may serve as a trap for preventing noise generated from the electronic elements 525 from being transmitted to the second antenna 440 (or, first antenna 420). For example, the second connection member 427 may be a C clip mounted on the printed circuit board 520 and may be grounded through a capacitor mounted on the printed circuit board 520, serving as a noise trap.

The second connection member 427 may form a noise return path 530 so that noise generated from the electronic elements 525 is not transmitted to the second antenna 440 (or, first antenna 420), and may serve to extend the electrical length of the antenna. For example, a portion of the first bridge 411 between the first connection member 425 and the second connection member 427 may operate as a part of the antenna.

Figure 6:
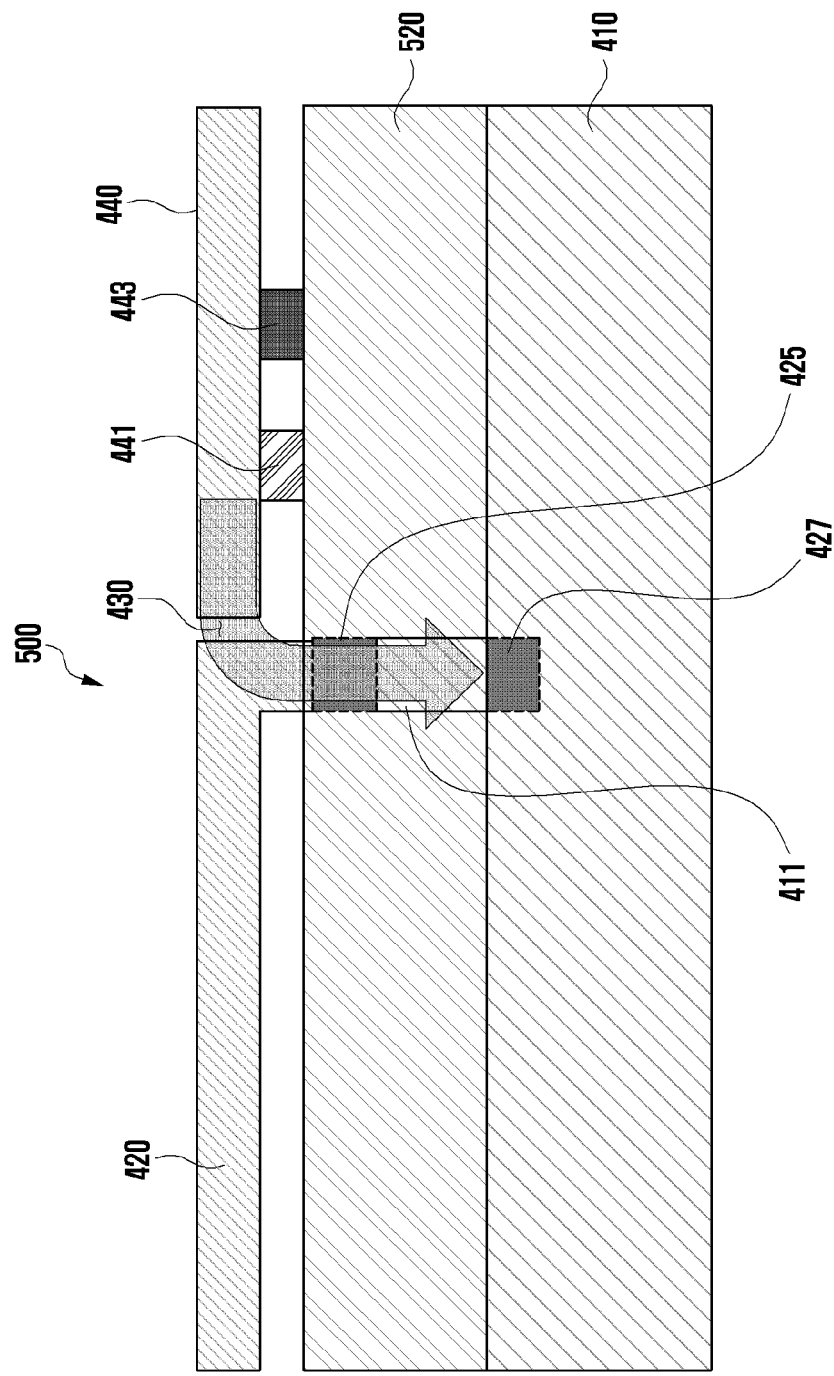
FIGS. 6 to 8 illustrate an operating principle based on the capacitance value of a first connection member in the electronic device including an antenna module according to various embodiments of the disclosure.
Figure 7:
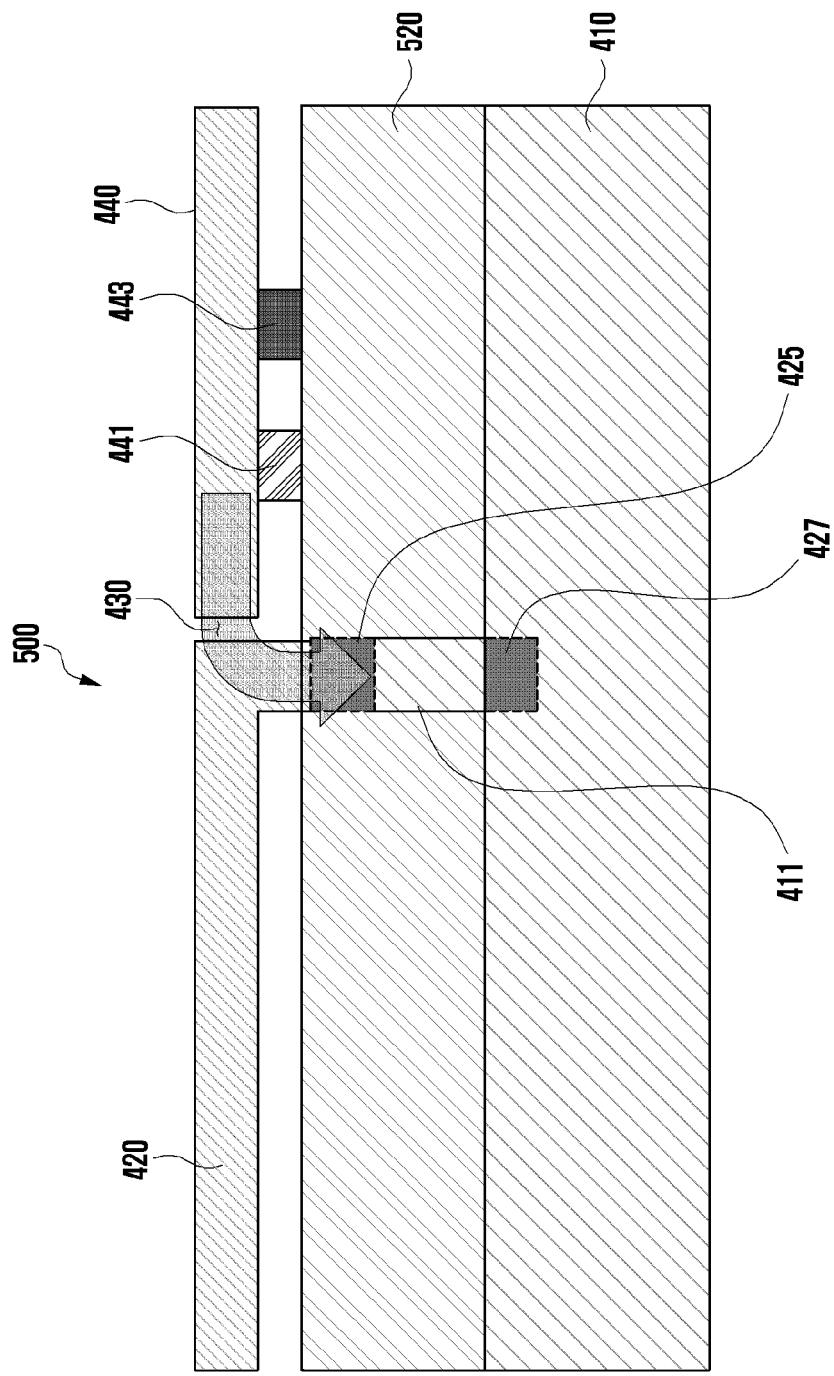
Figure 8:
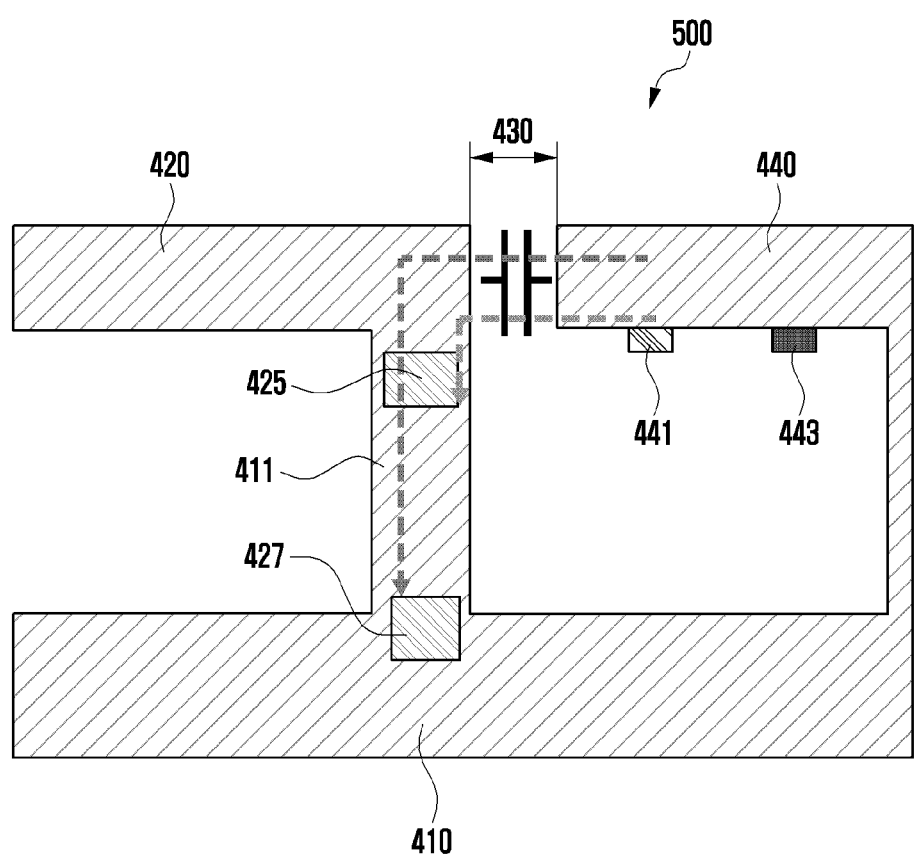

FIGS. 6 to 8 illustrate an operating principle based on the capacitance value of the first connection member in the electronic device including an antenna module according to various embodiments of the disclosure.

In the following description of FIGS. 6 to 8, repeated descriptions of the same configuration and function as those in the embodiments of FIG. 4 or FIG. 5 may be omitted.

In various embodiments, the electronic device 500 of FIGS. 6 to 8 may include the electronic device 100, 300, 400 or 500 shown in FIGS. 1 to 5. The embodiment in relation to the electronic device 500 of FIGS. 6 to 8 may be applied to the embodiment in relation to the electronic device 400 or 500 of FIGS. 4 and 5 described above.

With reference to FIGS. 6 to 8, in various embodiments of the disclosure, the resonant length of the second antenna 440 may be varied in the electronic device 500.

In one embodiment, the capacitance value of the first connection member 425 may be variable. The capacitance value of the second connection member 427 may be fixed.

In various embodiments, the second connection member 427 may be disposed closer to the electronic elements 525 than the first connection member 425. The second connection member 427 may serve to prevent noise generated from the electronic elements 525 from being transmitted to the second antenna 440 (or, first antenna 420). Noise generated from the electronic elements 525 mounted on the printed circuit board 520 may be returned to the printed circuit board 520 through, for example, a C clip being the second connection member 427.

For example, the second connection member 427 may be a C clip mounted on the printed circuit board 520 and may be grounded through a second capacitor mounted on the printed circuit board 520, serving as a noise trap.

In one embodiment, the electronic device 500 may adjust the electrical length of the antenna by varying the capacitance value of the first connection member 425.

With reference to FIG. 6, when the first connection member 425 has a low capacitance value, the resonant length of the second antenna 440 may extend through the cut-off portion 430 and the first connection member 425 to the second connection member 427.

With reference to FIG. 7, when the first connection member 425 has a high capacitance value, the resonant length of the second antenna 440 may be shortened to the cut-off portion 430 and the first connection member 425.

With reference to FIG. 8, when the first connection member 425 has a low capacitance value or a high capacitance value, the cut-off portion 430 may form a coupling path between the second antenna 440 and the first connection member 425.

In various embodiments, the second ground part 443 shown in FIGS. 6 to 8 may be connected or opened for efficiency of the second antenna 440.

In various embodiments, when the capacitance value of the first connection member 425 increases, the performance of the second antenna 440 may be improved in a band of mid or high frequencies. When the capacitance value of the first connection member 425 decreases, the performance of the second antenna 440 may be improved in a band of low or mid frequencies.

In various embodiments, the first connection member 425 and the second connection member 427 may serve as a reinforcement part that reinforces the mechanical strength of the electronic device 500.

Figure 9:
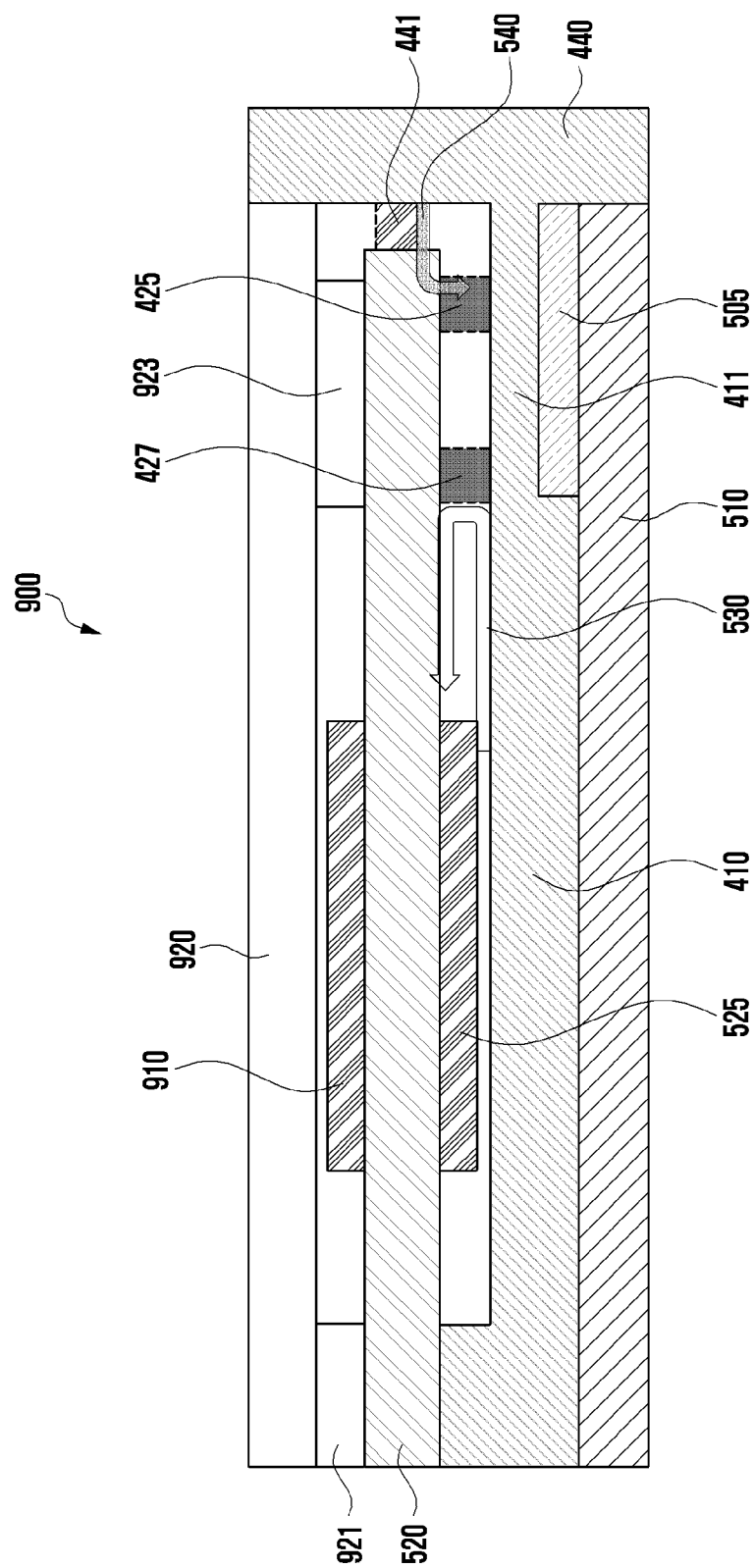
FIG. 9 illustrates a principle in which a first connection member and a second connection member serve as a reinforcement part in the electronic device including an antenna module according to various embodiments of the disclosure.

FIG. 9 illustrates a principle in which the first connection member and the second connection member serve as a reinforcement part in the electronic device including an antenna module according to various embodiments of the disclosure.

In the following description of FIG. 9, repeated descriptions of the same configuration and function as those in the embodiments of FIGS. 4 to 8 may be omitted.

In various embodiments, the electronic device 900 of FIG. 9 may include the electronic device 100, 300, 400 or 500 shown in FIGS. 1 to 8. The embodiment in relation to the electronic device 900 of FIG. 9 may be applied to the embodiment in relation to the electronic device 400 or 500 of FIGS. 4 to 8 described above.

With reference to FIG. 9, in various embodiments of the disclosure, the electronic device 900 may include electronic components 910 and a second support member 920 (e.g., rear case).

In one embodiment, the electronic components 910 may be mounted on one surface of the printed circuit board 520.

In various embodiments, the electronic components 910 may be mounted on a surface of the printed circuit board 520 different from that on which the electronic elements 525 are mounted. The electronic components 910 may include at least one of, for example, a processor, a memory, a radio frequency IC (RFIC), a power management IC (PMIC), a charging IC, a modem IC, or an interface.

In one embodiment, the second support member 920 may cover one surface (e.g., rear surface) of the electronic device 900. The second support member 920 may be coupled to at least a portion of the printed circuit board 520 by using at least one rib 921 and 923. The second support member 920 may include the second support member 360 shown in FIG. 3.

In various embodiments, when pressure such as an impact is applied from the outside of the electronic device 900, the printed circuit board 520 may be bent or damaged. In one embodiment, the first connection member 425 and the second connection member 427 disposed between the printed circuit board 520 and the support member 410 may serve as a reinforcement part that prevents the printed circuit board 520 from being bent or damaged due to an external impact.

FIGS. 10 to 13 illustrate an example of tuning the capacitance value of the first connection member in the electronic device including an antenna module according to various embodiments of the disclosure.

In the following description of FIGS. 10 to 13, repeated descriptions of the same configuration and function as those in the embodiment of FIGS. 4 to 9 may be omitted.

In various embodiments, the electronic device 1000, 1100, 1200 or 1300 of FIGS. 10 to 13 may include the electronic device 100, 300, 400, 500 or 900 shown in FIGS. 1 to 9. The embodiment in relation to the electronic device 1000, 1100, 1200 or 1300 of FIGS. 10 to 13 may be applied to the embodiment of FIGS. 4 to 9 described above.

With reference to FIGS. 10 to 13, in various embodiments of the disclosure, the electronic device 1000, 1100, 1200 or 1300 may include a switch circuit 1010 and a processor 1020.

In various embodiments, the capacitance value of the first connection member 425 may be variable. The capacitance value of the second connection member 427 may be fixed.

Figure 10:
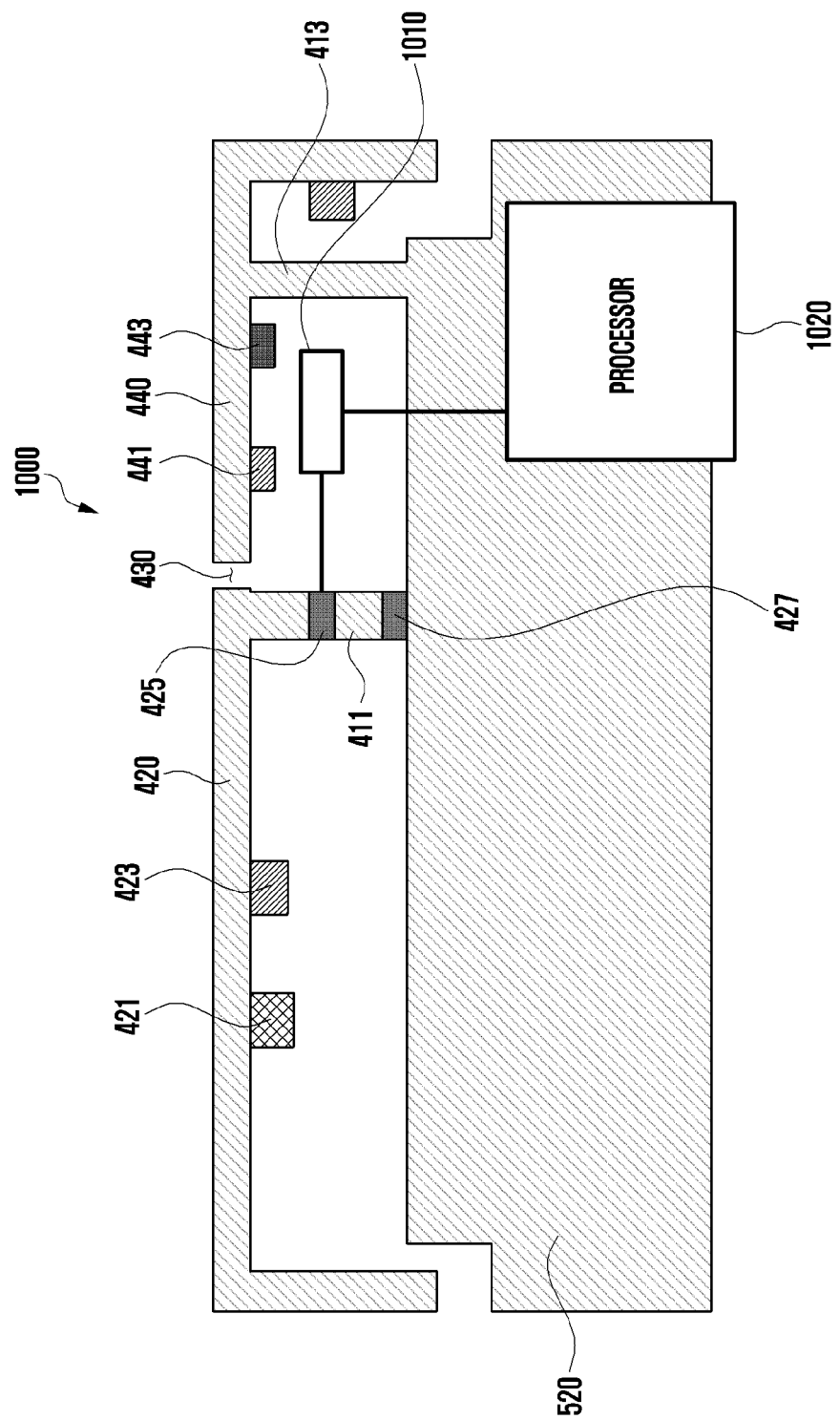
FIGS. 10 to 13 illustrate an example of tuning the capacitance value of the first connection member in the electronic device including an antenna module according to various embodiments of the disclosure.

With reference to FIG. 10, the first connection member 425 may be connected to the switch circuit 1010 configured on the printed circuit board 520. The processor 1020 may adjust the capacitance value of the first connection member 425 by switching the switch circuit 1010 on and off. The processor 1020 may adjust the capacitance value of the first connection member 425 so that the first antenna 420 or the second antenna 440 may have an optimum resonance value for each frequency band.

In various embodiments, the switch circuit 1010 may be selectively connected to the first connection member 425 through a plurality of shunt capacitors (not shown) having different capacitance values (e.g., first capacitor, second capacitor, . . . , n$^{th}$ capacitor) to tune the frequencies of the first antenna 420 and/or the second antenna 440. The shunt capacitors may be grounded.

In one embodiment, the processor 1020 may control the switch circuit 1010 to tune the capacitance value of the first connection member 425 to be large or small, thereby optimizing the performance of the first antenna 420 and/or the second antenna 440 for each frequency band.

In one embodiment, when the first antenna 420 and/or the second antenna 440 operate on a specific channel, the processor 1020 may improve performance of the frequency band corresponding to the specific channel while tuning the capacitance value of the first connection member 425 in units of about 1 pF.

Figure 11:
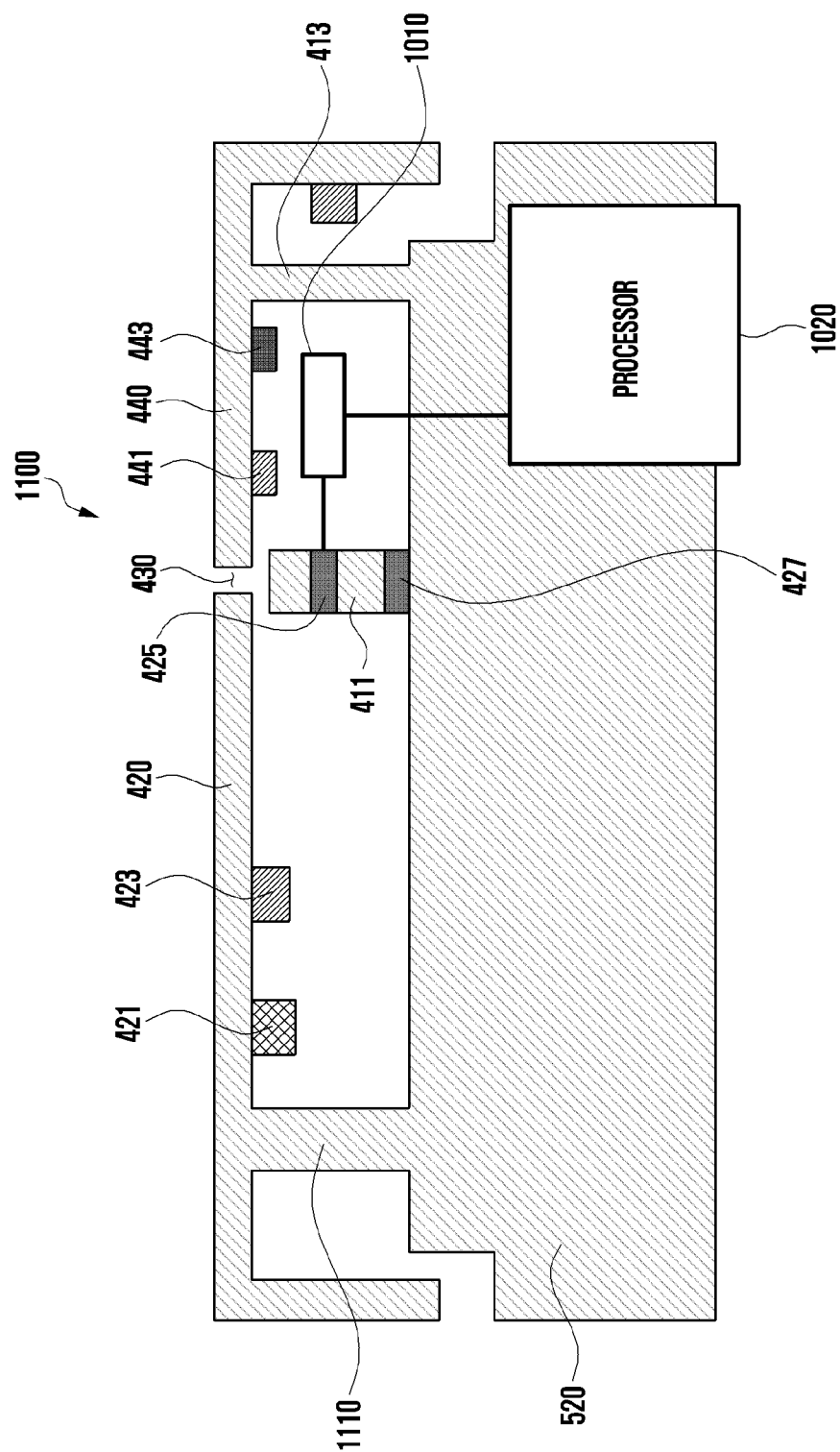

According to various embodiments of the disclosure, in the electronic device 1100 shown in FIG. 11, the first bridge 411 may be separated from the first antenna 420 without being connected thereto. In the electronic device 1100, the support member 410 and the first antenna 420 may be connected by using a third bridge 1110.

Figure 12:
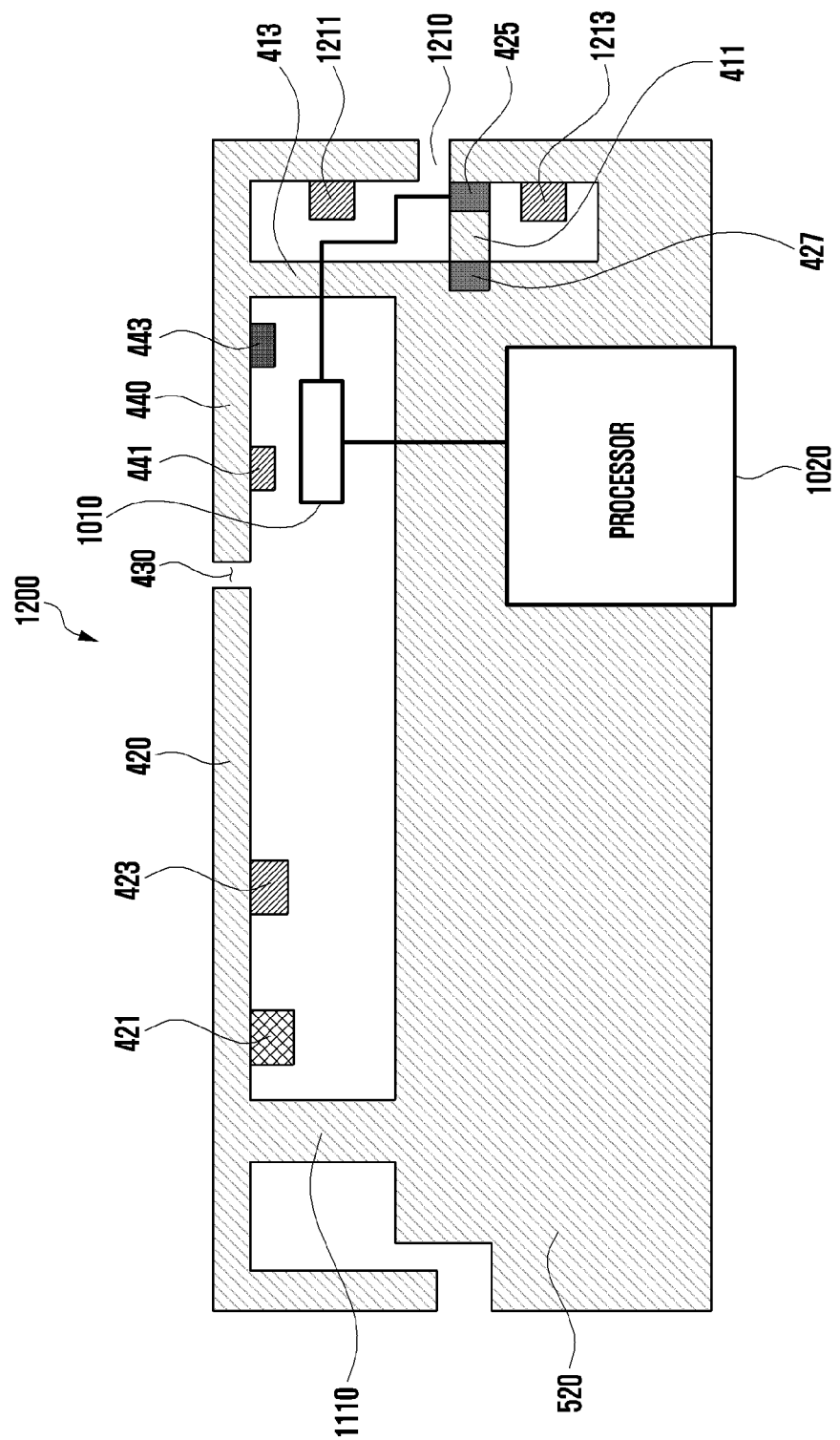

With reference to FIG. 12, in various embodiments of the disclosure, the electronic device 1200 may further include an additional cut-off portion 1210 in the side housing. The first bridge 411 may be formed close to the additional cut-off portion 1210. A third feeding part 1211 and a fourth feeding part 1213 may be disposed at positions close to the first bridge 411 and the additional cut-off portion 1210. The first connection member 425 may be disposed closer to the additional cut-off portion 1210 than the second connection member 427.

Figure 13:
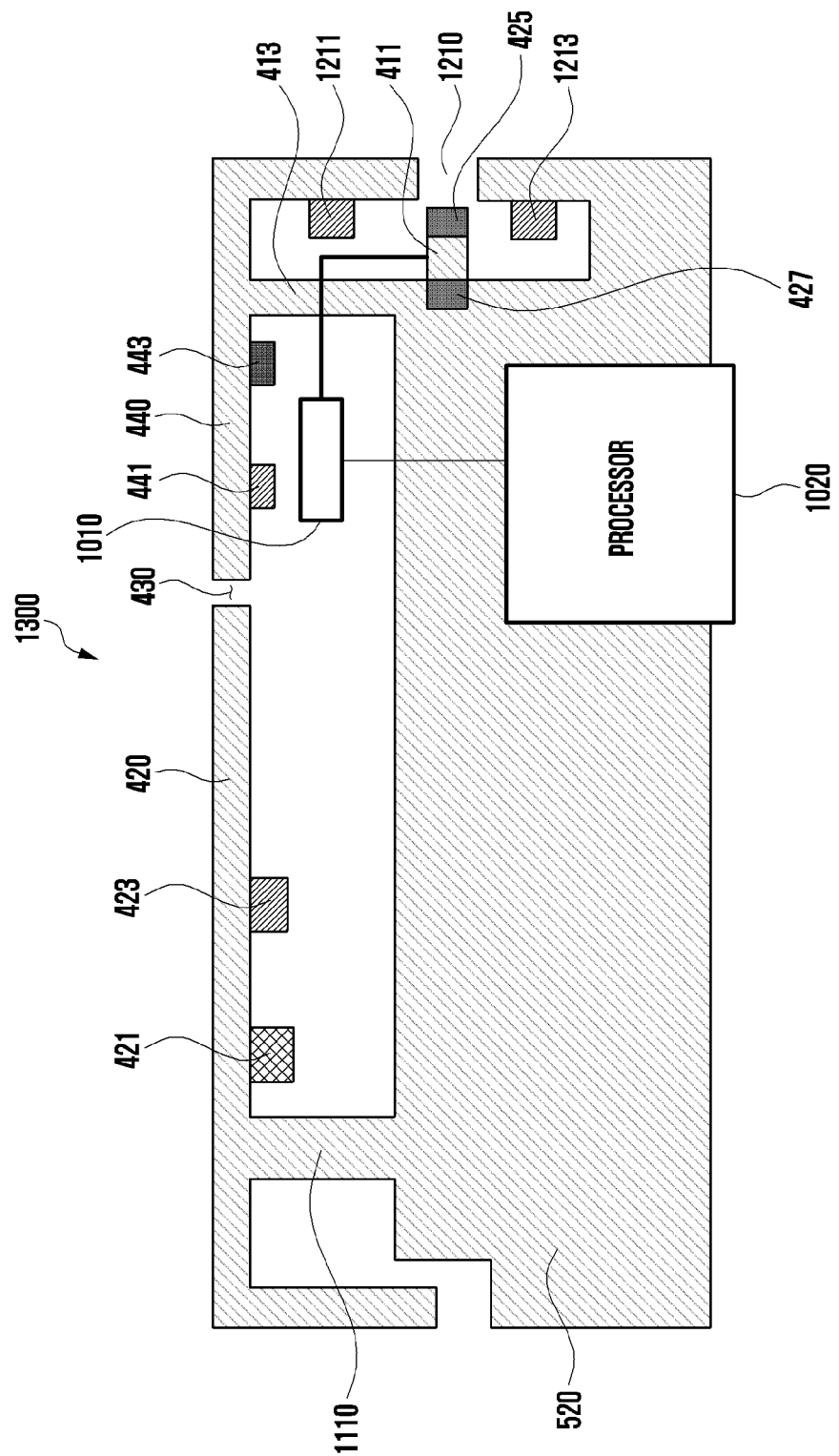

According to various embodiments of the disclosure, in the electronic device 1300 shown in FIG. 13, the first bridge 411 may be separated from the side housing without being connected thereto.

In various embodiments, in the electronic device 1200 or 1300 of FIG. 12 or FIG. 13, a bridge may be not formed at a position close to the cut-off portion 430 formed between the first antenna 420 and the second antenna 440.

Figure 14:
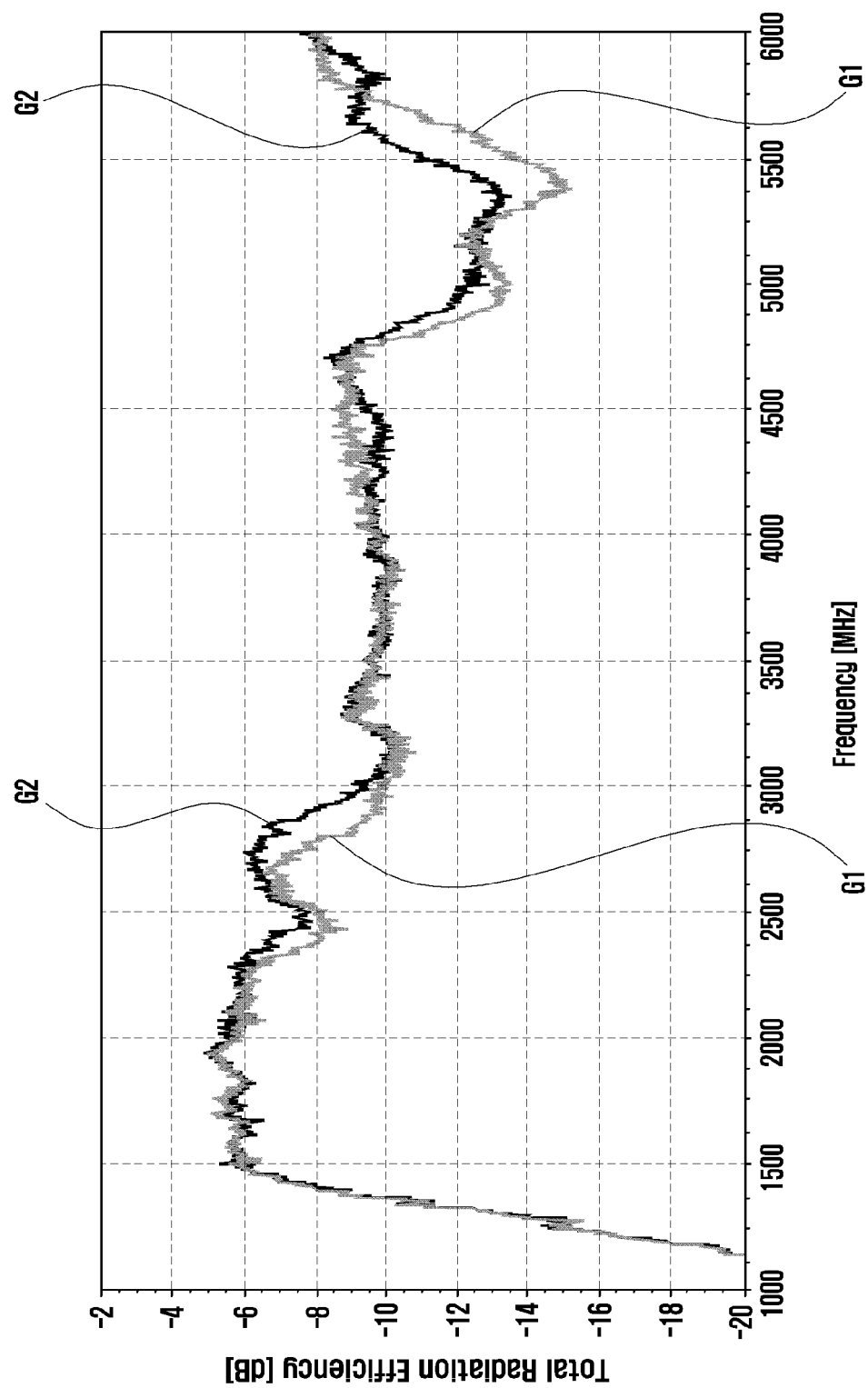
FIG. 14 illustrates measurement results for radiation efficiency of the electronic device including an antenna module according to various embodiments of the disclosure.

FIG. 14 illustrates measurement results for radiation efficiency of the electronic device including an antenna module according to various embodiments of the disclosure.

In one embodiment, when the capacitance value of the first connection member 425 is adjusted in a range of about 4.5 to 4.9 pF and the capacitance value of the second connection member 427 is about 100 pF, it can be seen that the performance (radiation efficiency) of the second antenna 440 in a band of about 2300 to 2800 MHz or in a band of about 5000 to 5800 MHz is improved by about 2 dB from G1 to G2 irrespective of the XGND logic of the first antenna 420.

At least one embodiment illustrates that the performance of the first antenna 420 is not affected even if the capacitance value of the first connection member 425 is adjusted. In addition, radiation efficiency for each resonance frequency of the second antenna 440 is improved according to the adjustment of the capacitance value of the first connection member 425.

While the disclosure has been shown and described with reference to various embodiments thereof, it should be understood that many variations and modifications of the basic concepts described herein will still fall within the spirit and scope of the disclosure as defined in the appended claims and their equivalents.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
   a housing constituting an external appearance of the electronic device;
   a support member including a first bridge;
   a printed circuit board coupled to one surface of the support member;
   a first antenna constituting a first part of the housing and connected to the support member through the first bridge;
   a second antenna constituting a second part of the housing;
   a cut-off portion separating the first antenna and the second antenna; and
   a first connection member and a second connection member coupled to the first bridge,
   wherein the first connection member is connected to a ground of the printed circuit board through a first capacitor and is disposed closer to the cut-off portion than the second connection member connected to the ground of the printed circuit board through a second capacitor.

2. The electronic device of claim 1, wherein the first capacitor is a variable capacitor.

3. The electronic device of claim 1, wherein the first connection member and the second connection member are connected to the printed circuit board using a contact component.

4. The electronic device of claim 1, wherein:
the support member further includes a second bridge; and
the second antenna is connected to the support member through the second bridge.

5. The electronic device of claim 1, wherein:
the first antenna includes a first ground part and a first feeding part formed at an inner side; and
the second antenna includes a second ground part and a second feeding part formed at an inner side.

6. The electronic device of claim 5, wherein:
the first feeding part is disposed closer to the cut-off portion than the first ground part; and
the second feeding part is disposed closer to the cut-off portion than the second ground part.

7. The electronic device of claim 5, wherein at least a portion of the first antenna, the cut-off portion at least a portion of the second antenna, the second feeding part, the first connection member, and the second connection member are configured to form a coupling zone.

8. The electronic device of claim 5, wherein the first connection member is configured to form a path for inducing a current of the second antenna between the second feeding part and the first bridge.

9. The electronic device of claim 1, wherein the second connection member is disposed closer to electronic elements mounted on the printed circuit board than the first connection member and is configured to prevent noise generated from the electronic elements from being transmitted to the first antenna or the second antenna.

10. The electronic device of claim 1, wherein if the first connection member has a low capacitance value, a resonant length of the second antenna extends to the second connection member through the cut-off portion and the first connection member.

11. The electronic device of claim 1, wherein if the first connection member has a high capacitance value, a resonant length of the second antenna is shortened to the first connection member.

12. The electronic device of claim 1, wherein the cut-off portion is formed to form a coupling path between the first antenna and the second antenna.

13. The electronic device of claim 1, wherein the first connection member and the second connection member are disposed between the support member and the printed circuit board.

14. The electronic device of claim 1, further comprising:
a switch circuit; and
a processor,
wherein the processor is configured to adjust a capacitance value of the first connection member by controlling the switch circuit connected to the first connection member.

15. An electronic device comprising:
a housing constituting an external appearance of the electronic device;
a support member including a first bridge and a second bridge;
a printed circuit board coupled to one surface of the support member;
a display coupled to the other side of the support member;
a first antenna constituting a first part of the housing and connected to the support member through the first bridge;
a second antenna constituting a second part of the housing and connected to the support member through the second bridge;
a cut-off portion separating the first antenna and the second antenna;
a first connection member and a second connection member coupled to the first bridge;
a switch circuit connected to the first connection member; and
a processor operatively connected to the display and the switch circuit,
wherein the processor is configured to adjust a capacitance value of the first connection member by controlling the switch circuit.

16. The electronic device of claim 15, wherein:
the first connection member is disposed closer to the cut-off portion than the second connection member; and
the second connection member has a fixed capacitance value.

17. The electronic device of claim 15, wherein the second connection member is disposed closer to electronic elements mounted on the printed circuit board than the first connection member and is configured to prevent noise generated from the electronic elements from being transmitted to the first antenna or the second antenna.

18. The electronic device of claim 15, wherein if the first connection member has a low capacitance value, a resonant length of the second antenna extends to the second connection member through the cut-off portion and the first connection member.

19. The electronic device of claim 15, wherein if the first connection member has a high capacitance value, a resonant length of the second antenna is shortened to the first connection member.

20. The electronic device of claim 15, wherein the first connection member and the second connection member are disposed between the support member and the printed circuit board.

* * * * *